United States Patent [19]
Chillara

[11] Patent Number: 5,790,378
[45] Date of Patent: Aug. 4, 1998

[54] HIGH DENSITY INTEGRATED CIRCUIT PACKAGE INCLUDING INTERPOSER

[75] Inventor: Satya N. Chillara, San Jose, Calif.

[73] Assignee: National Semiconductor Corporation, Santa Clara, Calif.

[21] Appl. No.: 532,955

[22] Filed: Sep. 22, 1995

[51] Int. Cl.[6] .................................................. H05K 7/20
[52] U.S. Cl. ..................... 361/719; 174/52.4; 257/675; 361/813; 361/773
[58] Field of Search ........................ 174/52.1, 52.2, 174/52.4; 228/175, 180.5, 180.22; 257/666, 675, 685, 686, 701, 704, 706, 707, 712, 713, 723, 735, 773, 787; 361/767, 770, 772, 773, 790, 813, 820, 704–707, 717–719

[56] References Cited

U.S. PATENT DOCUMENTS

| | | | |
|---|---|---|---|
| 4,677,526 | 6/1987 | Muhling | 361/386 |
| 5,184,211 | 2/1993 | Fox | 257/706 |
| 5,378,981 | 1/1995 | Higgins, III | 324/765 |
| 5,403,784 | 4/1995 | Hashemi | 437/217 |
| 5,422,514 | 6/1995 | Griswald | 257/679 |
| 5,483,024 | 1/1996 | Russell | 174/52.4 |
| 5,489,059 | 2/1996 | Rostoker | 228/175 |

*Primary Examiner*—Gerald P. Tolin
*Attorney, Agent, or Firm*—Skjerven, Morrill, MacPherson, Franklin & Friel; David E. Steuber

[57] ABSTRACT

An integrated circuit package includes a first lead frame attached to the top surface of a substrate or interposer on which the die is mounted, and a second lead frame attached to the bottom surface of the interposer. The first lead frame is connected to bonding pads on the die by conventional means, and the second lead frame is attached to different bonding pads on the die by means of traces in the interposer and vias which extend through the interposer. The result is a package having a substantially greater lead density than packages which contain only a single lead frame.

23 Claims, 3 Drawing Sheets

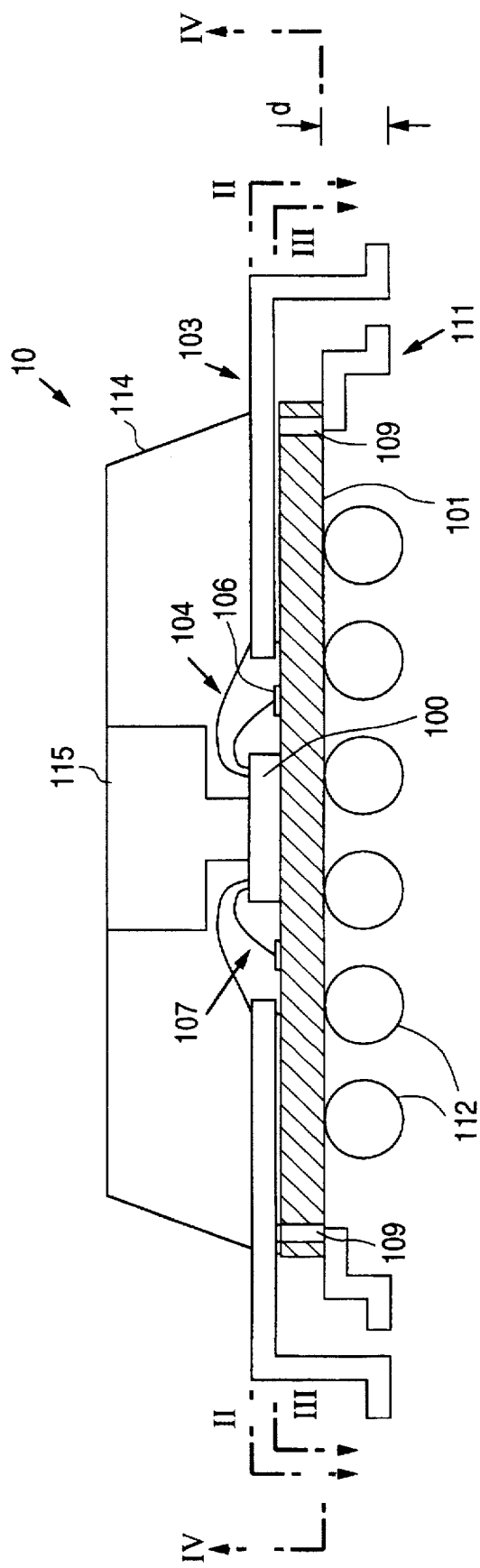
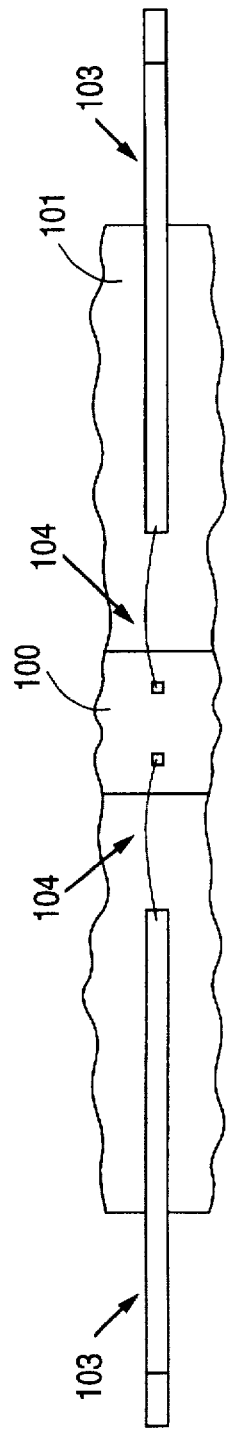
FIG. 1
FIG. 2

HIGH DENSITY INTEGRATED CIRCUIT PACKAGE INCLUDING INTERPOSER

FIELD OF THE INVENTION

This invention relates to packages used to contain and mount integrated circuits.

BACKGROUND OF THE INVENTION

Integrated circuits are normally housed in packages which include the IC chip itself, a protective cap, and a lead frame which is used to make electrical connections between the chip and external circuitry and devices. The leads are typically arrayed outwardly from the chip. The size of the package and the distance between the leads (pitch) place an upper limit on the number of leads that can be connected to the chip. For example, a package measuring 28×28×3.4 mm and having a lead pitch of 0.5 mm can have a maximum of about 208 leads.

With the increasing size and complexity of integrated circuits, it is desirable to increase the number of leads in a package, i.e., the "density" of the leads, beyond what is possible using conventional techniques.

This invention provides a solution to this problem.

SUMMARY OF THE INVENTION

A high-density integrated circuit (IC) package according to this invention includes an IC chip mounted on a substrate or interposer and multiple lead frames disposed vertically with respect to the interposer. In a preferred embodiment, the ends of the lead frames are bent at different distances from the chip so that the package can conveniently be mounted on, for example, a printed circuit board.

In the preferred embodiment, a first lead frame is positioned above the interposer and a second lead frame is positioned below the interposer, the second lead frame being connected to the chip by means of vias through the interposer. The chip may be connected to the lead frames by a variety of techniques, including bond wires, tape automated bonding (TAB) and flip chip bonding. Solder balls may be used to provide additional connections to the chip.

In another embodiment, two chips are mounted on opposite sides of the interposer, and each chip is connected to a corresponding lead frame.

BRIEF DESCRIPTION OF THE DRAWING

FIG. 1 illustrates a view of a first embodiment in accordance with the invention taken at a vertical cross-section.

FIG. 2 illustrates a partial plan view of the first embodiment taken at a horizontal cross-section above the top lead frame.

DESCRIPTION OF THE INVENTION

Figure 3:
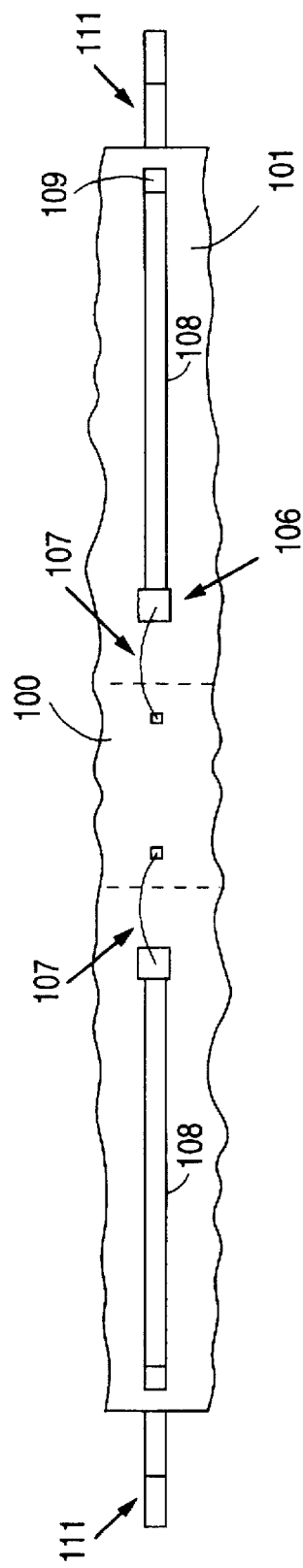
FIG. 3 illustrates a partial plan view of the first embodiment taken at a horizontal cross-section above the interposer.

FIG. 1 illustrates a vertical cross-sectional view of a package 10 representing a first embodiment of the invention. Package 10 includes an IC die 100 which is mounted to a substrate or interposer 101. Interposer 101 can be manufactured of BT epoxy or polyimide, and is typically about 20 mils thick. In a normal fashion, die 100 is connected to a top lead frame 103 by means of bond wires 104, which extend from bonding pads on die 100 to individual leads within lead frame 103. During fabrication, lead frame 103 is held together by a dambar (not shown) which is broken so as to electrically separate the individual leads after lead frame 103 has been installed in the package. Lead frame 103 is bonded to interposer 101 by adhesive insulating tape or nonconductive epoxy. In other embodiments, die 100 could be connected to lead frame 103 by tape automated bonding (TAB) or flip-chip techniques.

FIG. 2 shows a partial plan view taken at cross-section II—II shown in FIG. 1, showing two opposite leads within lead frame 103.

As shown in the partial plan view of FIG. 3, taken at section III—III shown in FIG. 1, a second set of bonding wires 107 are connected between bonding pads located on die 100 and bonding pads 106. Interposer 101 contains a plurality of conductive traces 108, typically formed of copper, which extend outward from bonding pads 106 to vias 109 located near the perimeter of interposer 101. Traces 108 are covered with solder mask to electrically isolate them.

Figure 4:
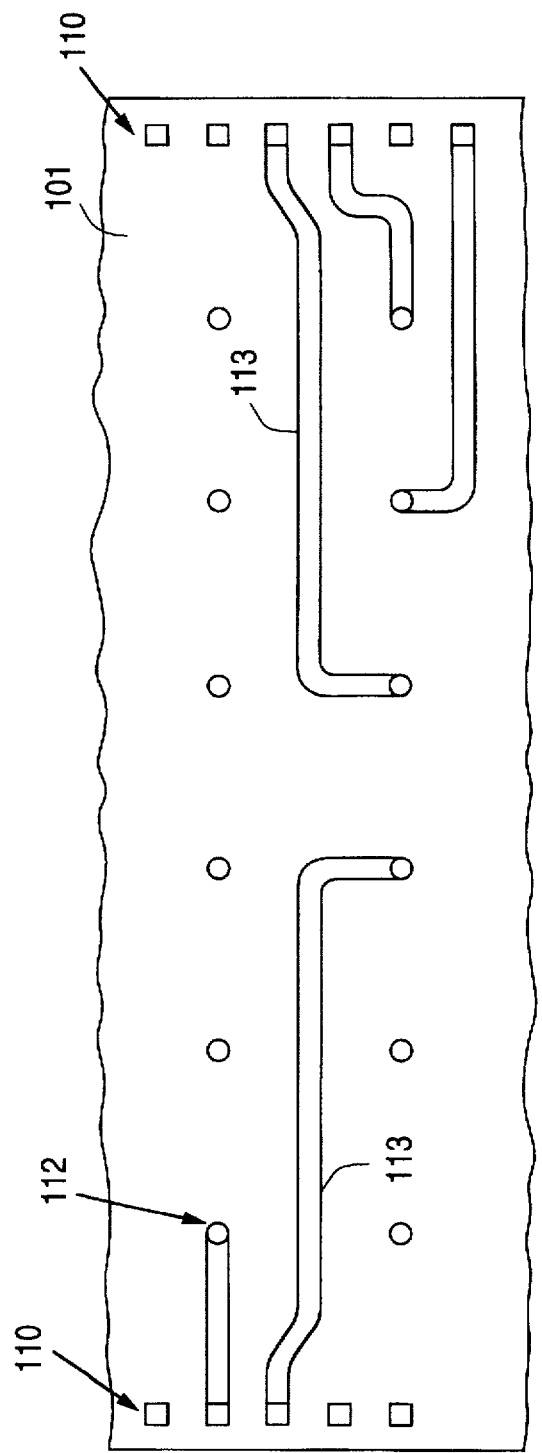
FIG. 4 illustrates a partial bottom plan view of the first embodiment taken at a horizontal crosssection below the interposer.

Vias 109 are filled with a conductive material (e.g., copper) and extend through interposer 101 to a series of pads 110 on the bottom of interposer 101 (see FIG. 4). Pads 110 are preferably made of plated Ni/Au, and a second lead frame 111 is bonded to pads 110 by Au/Sn eutectic bonding, with individual leads in lead frame 111 lining up with individual pads 110. Thus conductive paths are formed from bonding pads on die 100 and through bonding wires 107, traces 108 and vias 109 to leads in the second lead frame 111. Alternatively, lead frame 111 can be bonded to the bottom of interposer 101 by Au/Ag or Au/Au thermocompression bonding, solder attachment (using 96.5% Sn/3.5% Ag or 90% Sn/10% Pb solder), Z-conductive adhesive, or solder ball attachment techniques.

The individual leads in lead frames 103 and 111 can be connected to a printed circuit board or other element by conventional means. In addition, as shown in FIGS. 1 and 4 (the latter being a bottom partial plan view taken a cross-section IV—IV shown in FIG. 1), a plurality of solder balls 112 are optionally provided on the bottom of interposer 101. Conductive traces 113 extend from certain pads 110 (which contact vias 109) to solder balls 112. Preferably, the offset "d" between the bottom of interposer 101 and the bottoms of lead frames 103 and 111 (see FIG. 1) is sufficient to allow solder balls 112 to be used to make connections to points on a printed circuit board or other flat surface.

Figure 7:
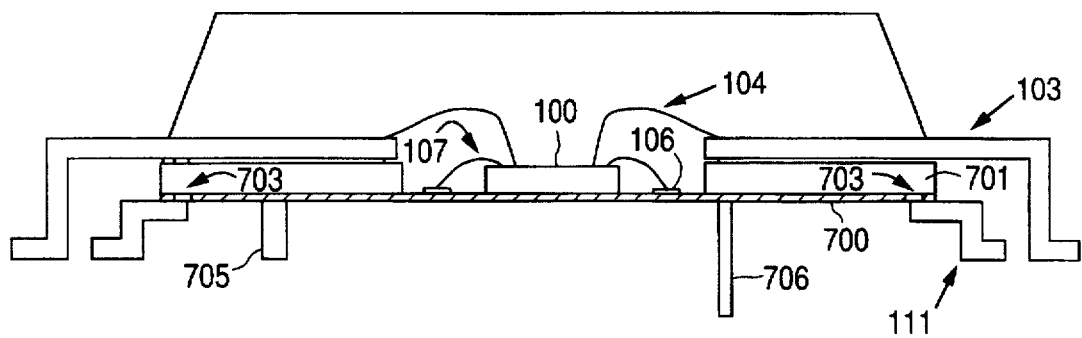
FIG. 7 illustrates a vertical cross-sectional view of an embodiment in which the die is mounted on flexible tape.

As shown in FIG. 7, solder columns (e.g., 87 mils high and 50 mils in diameter), represented by solder column 705, or pins to be plugged into through-holes, represented by pin 706, can be substituted for solder balls 112 as a means of making connections to a printed circuit board or other surface below the package. The pins may be formed of KOVAR (54%Fe-17%Co-29%Ni) or ALLOY 42 (58%Fe-42%Ni).

Figure 6:
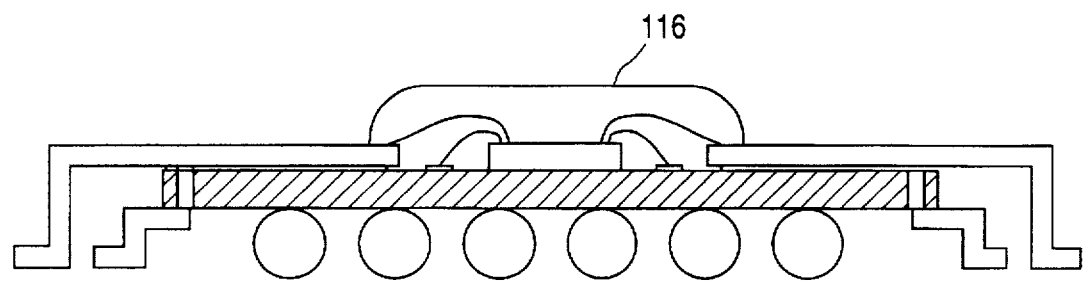
FIG. 6 illustrates a vertical cross-sectional view of an embodiment having a blob over the die and bonding wires.

After the connections on the top side of interposer 101 have been made, a protective cap 114, which may be molded plastic, a ceramic material or metal, and which may include a heat sink 115, is placed over the die and leads. Alternatively, a smaller "blob" consisting of an encapsulant or other medium, such as blob 116 shown in FIG. 6, may be placed over the die and bonding wires.

Figure 5:
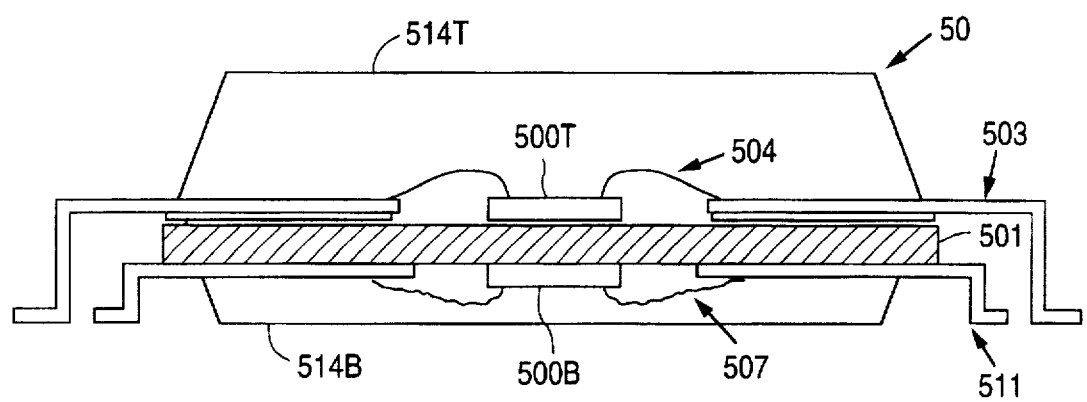
FIG. 5 illustrates a view of a second embodiment in accordance with the invention taken at a vertical cross-section.

A package 50 representing a second embodiment of the invention is shown in FIG. 5. Dies 500T and 500B are attached to the top and bottom surfaces, respectively, of an interposer 501. Bonding pads on die 500T are connected via bonding wires 504 to the individual leads in a lead frame 503, which is attached to the top surface of interposer 501 with insulating adhesive tape or nonconductive epoxy. Alternatively, lead frame 503 can be integrated with interposer 501 using conventional techniques. A second lead frame 511 is likewise attached to the bottom surface of interposer 501 and connected through bonding wires 507 to bonding pads on die 500B. The ends of the leads of lead frames 503 and 511 are bent and positioned such that they may easily be connected to points on the surface of a printed circuit board.

A protective cap 514T is placed over die 500T and the leads of lead frame 503. Likewise, a protective cap 514B is placed over die 500B and the leads of lead frame 511.

Using the principles of this invention, the density of the leads emanating from an integrated circuit may be greatly increased.

While specific embodiments according to the invention have been disclosed, it will be apparent to those skilled in the art that numerous alternative embodiments may be constructed without departing from the broad principles of this invention. For example, instead of using a interposer made of a substrate, the interposer could consist of flexible tape formed of, for example, 2-mil thick polyimide, with or without an attached heat sink. Such an embodiment is shown in FIG. 7, wherein die 100 is mounted on tape 700 and is surrounded by a heat sink 701, which is also attached to tape 700. Conductive traces extend from bonding pads 106 to vias 703 which are formed in tape 700.

All such alternatives are intended to be within the broad scope of this invention.

I claim:

1. An integrated circuit package comprising:

an interposer having a first surface and a second surface, said second surface being opposite to said first surface;

a die mounted on said first surface of said interposer;

a first lead frame mounted on said first surface of said interposer;

a second lead frame mounted on said second surface of said interposer;

a first set of bonding wires extending from a first plurality of pads on said die to individual leads in said first lead frame;

a first set of conductive traces on said first surface of said interposer, said first set of conductive traces being isolated electrically from said first lead frame;

a second set of bonding wires extending from a second plurality of pads on said die to said first set of conductive traces; and a set of vias extending through said interposer, said vias being filled with a conductive material, said first set of conductive traces being connected to individual leads of said second lead frame by means of said set of vias.

2. The integrated circuit package of claim 1 further comprising a plurality of solder balls attached to said second surface of said interposer, said plurality of solder balls being connected to a third plurality of pads on said die by means of a set of conductive paths, wherein each of said conductive paths comprises at least one of said conductive traces on said second surface of said interposer, at least one of said vias extending through said interposer, and at least one of said first set of conductive traces.

3. The integrated circuit package of claim 1 further comprising a plurality of solder columns attached to said second surface of said interposer, said solder columns being connected to a third plurality of pads on said die by means of a set of conductive paths.

4. The integrated circuit package of claim 1 further comprising a plurality of pins attached to said second surface of said interposer, said pins being connected to a third plurality of pads on said die by means of a set of conductive paths.

5. The integrated circuit package of claim 1 wherein said interposer comprises a flexible tape.

6. The integrated circuit package of claim 5 further comprising a heat sink attached to said tape.

7. The integrated circuit package of claim 1 further comprising a protective member covering said die.

8. The integrated circuit package of claim 7 wherein said protective member comprises a cap which covers substantially the entire top of said package.

9. The integrated circuit package of claim 8 wherein said cap comprises molded plastic.

10. The integrated circuit package of claim 8 wherein said cap.

11. The integrated circuit package of claim 8 wherein said cap comprises a ceramic material.

12. The integrated circuit package of claim 7 wherein said protective member comprises a blob covering said die and said first and second sets of bonding wires.

13. The integrated circuit package of claim 7 wherein said protective member comprises a heat sink.

14. The integrated circuit package of claim 1 wherein at least one of said first and second lead frames is attached to said interposer by a eutectic bond.

15. The integrated circuit package of claim 1 wherein at least one of said first and second lead frames is attached to said interposer by a thermocompression bond.

16. The integrated circuit package of claim 1 wherein at least one of said first and second lead frames is attached to said interposer with solder.

17. The integrated circuit package of claim 1 wherein at least one of said first and second lead frames is attached to said interposer with Z-conductive adhesive.

18. The integrated circuit package of claim 1 wherein at least one of said first and second lead frames is attached to said interposer by a solder ball attachment technique.

19. The integrated circuit package of claim 1 wherein at least one of said first and second lead frames is attached to said interposer with nonconductive epoxy.

20. The integrated circuit package of claim 1 wherein at least one of said first and second lead frames is attached to said interposer with insulating tape.

21. An integrated circuit package comprising:

an interposer having a first surface and a second surface, said second surface being opposite to said first surface;

a first die and a first lead frame mounted on said first surface of said interposer;

a second die and a second lead fame mounted on said second surface of said interposer;

a first set of bonding wires extending from a plurality of bonding pads on said first die to a first group of leads in first lead frame, the individual leads in said first group extending from the package in a first direction; and a second set of bonding wires extending from a plurality of bonding pads on said second die to a second group of leads in said second lead frame, the individual leads in said second group extending from the package in said first direction.

22. The integrated circuit-package of claim 21 wherein said first lead frame comprises a third group of leads and said second lead frame comprises a fourth group of leads, said third and fourth groups of leads extending from said package in a second direction.

23. The integrated circuit package of claim 22 wherein said first and second directions are opposite to each other.

* * * * *